United States Patent
Sato et al.

[11] Patent Number: 5,885,316
[45] Date of Patent: Mar. 23, 1999

[54] NOZZLE TIP FOR GLASS INJECTION CARTRIDGE

[75] Inventors: Yasuhiko Sato; Hiroaki Fujita, both of Omiya, Japan

[73] Assignee: Fuji Photo Optical Co., Ltd., Omiya, Japan

[21] Appl. No.: 977,670

[22] Filed: Nov. 24, 1997

[30] Foreign Application Priority Data

Nov. 25, 1996 [JP] Japan ................................. 8-328054

[51] Int. Cl.$^6$ .............................. C03B 5/26; C03B 7/00; C03B 17/00
[52] U.S. Cl. ................ 65/324; 65/207; 65/209; 65/169; 65/170; 65/327; 65/315; 65/374.1; 65/374.12; 65/374.13; 425/549; 425/568
[58] Field of Search ............................ 65/207, 209, 169, 65/170, 324, 327, 325, 374.1, 374.12, 374.13; 425/549, 568

[56] References Cited

U.S. PATENT DOCUMENTS

| 2,201,049 | 5/1940 | Moore ................................... 65/374.13 |
| 3,567,417 | 3/1971 | Winter .................................. 65/374.13 |
| 4,132,538 | 1/1979 | Eolin et al. ............................... 65/72 |
| 4,140,507 | 2/1979 | Costin et al. ......................... 65/374.13 |
| 4,402,719 | 9/1983 | Bhatti .................................... 65/374.12 |
| 4,404,009 | 9/1983 | Bhatti et al. .......................... 65/374.12 |
| 4,427,428 | 1/1984 | Bhatti et al. .......................... 65/374.12 |
| 5,540,746 | 7/1996 | Sasaki et al. ............................. 65/122 |

FOREIGN PATENT DOCUMENTS

| 392466 | 10/1990 | European Pat. Off. ............ 65/374.12 |
| 61-136928 | 6/1986 | Japan ..................................... 65/374.1 |
| 63-182225 | 7/1988 | Japan ................................... 65/374.13 |
| 3-153533 | 7/1991 | Japan ................................... 65/374.12 |
| 436250 | 10/1935 | United Kingdom ..................... 65/325 |

Primary Examiner—Peter Chin
Assistant Examiner—Michael P. Colaianni
Attorney, Agent, or Firm—Oblon, Spivak, McClelland, Maier & Neustadt, P.C.

[57] ABSTRACT

A nozzle tip for a glass injection cartridge loaded with a rod-shaped glass material and having a heater for melting down the glass material into a molten state for injection into a mold, the nozzle tip containing:

a) a nozzle body having a conical shape converging forwardly from a rear-end portion fitted on a fore-end portion of the glass injection cartridge, the nozzle body being formed of tungsten carbide and internally defining a molten glass passage extending axially throughout the nozzle body from the rear-end portion toward a converging fore-end portion to be connected to the mold; and b) a glass releasing layer coated substantially on the entire surface of the nozzle body including the molten glass passage, wherein the glass releasing layer is selected from the group consisting of HfN, BN, TiAlN, CrN, ZrN and TiN.

8 Claims, 3 Drawing Sheets

NOZZLE TIP FOR GLASS INJECTION CARTRIDGE

BACKGROUND OF THE INVENTION

Field of the Invention

This invention relates to a nozzle tip for glass injection cartridge to be used for injecting molten glass into a mold in an injection molding process for optical lenses or other vitreous high-precision optical elements.

DESCRIPTION OF THE BACKGROUND

Conventionally, vitreous high-precision optical elements like optical glass lenses, for example, have been manufactured by grinding and polishing processes, which however are notoriously low in production efficiency and have difficulties in producing aspheric lenses. Therefore, in order to overcome these problems, there has been a trend toward replacing the conventional grinding and polishing processes by other processes, for example, by a compression molding process in which preformed glass material is compressed within a mold with transfer surfaces thereby to impart predetermined contour and surface characteristics to the glass material. Further, there have also been developed and introduced so-called injection molding processes in which glass material is heated into molten state or into a fluidized state by lowering its viscosity under heated conditions, and the resulting molten glass is injected into a mold with transfer surfaces thereby to impart predetermined contour and surface characteristics to glass as it solidifies within the mold. An injection molding process of this sort is described, for example, in Japanese Laid-Open Patent Application H5-97451. Injection molding processes which do not require to prepare preforms of glass material can make it possible to manufacture optical glass elements in a very facilitated manner and at lower cost as compared with compression molding processes, and therefore are advantageous from the standpoint of production efficiency and production cost.

In glass injection molding, glass material needs to be melt down to a viscosity of 104 poise or lower. The temperature at which glass material reaches its working viscosity, that is to say, the working temperature of glass material varies depending upon the composition of the glass material, but in most cases it is higher than 400° C. In the case of a glass composition which requires a working temperature as high as or higher than 700° C., it would not be suitable to employ an injection molding process in consideration of damages to molds, which normally result in a considerably shortened service life of molds. However, since molds are exempted from serious thermal damages at glass working temperatures of about 630° C. or lower, a glass composition with a working temperature at about 630° C. or lower can be suitably selected for injection molding purposes.

A nozzle portion of a glass injection cartridge, which is held in contact with molten glass, is naturally heated up to a glass working temperature. Therefore, normally it is the general practice to employ tungsten carbide for glass injection nozzle tips because of its advantageous properties, including sufficient thermal resistance free of thermal deformations or degenerations, along with suitable hardness which permits easy machining. It is unlikely for a glass injection nozzle tip of tungsten carbide to undergo any serious damages in particular even if heated up to 630° C., the maximum working temperature in glass injection molding, as long as it is used in nitrogen gas atmosphere. However, in connection with glass injection molding using a tungsten carbide nozzle tip, there has been a problem that glass tends to remain in the vicinity of the nozzle hole due to inferior mold releasing characteristics for molten glass. After injection of molten glass into a mold, an injection nozzle is separated from the mold each time. Although the injection nozzle itself is constantly heated by a heater, the residual glass deposits in the vicinity of the nozzle hole, which is exposed to the atmosphere within a molding chamber, can be cooled off to such a level as to start solidifying during a time period between separation of the injection nozzle from one mold and delivery of a fresh mold into the injecting station. If glass injection is repeatedly continued in this way, it is very probable that fragments of solidified glass be sent into the molds which are delivered to and set in the injecting station one after another.

SUMMARY OF THE INVENTION

With the foregoing situations in view, it is an object of the present invention to provide a nozzle tip for a glass injection cartridge, which has excellent mold releasing characteristics particularly for molten glass, free of deposition of solidified glass on and in the vicinity of the outer end of a nozzle hole.

In accordance with the present invention, the above-stated objective is achieved by the provision of a nozzle tip for glass injection cartridge accommodating a glass rod to be heated and injected into a mold in molten state, the nozzle tip having: a mold releasing layer coated on surfaces of a nozzle body and consisting of a material having good mold releasing characteristics for molten glass.

For the nozzle body itself, it is suitable to use tungsten carbide which has suitable properties in hardness and thermal resistance immune to thermal deformations or degenerations. The mold releasing layer is coated on the nozzle body at least on surfaces of a molten glass passage in the nozzle body, preferably including surfaces at and around an outer spout end of a nozzle hole.

The mold releasing layer is formed of a nitride of elements belonging to Groups 3b, 4a, 5a and 6a of the Periodic Table, more preferably, a nitride selected from the group consisting of HfN, BN, TiAlN, CrN, ZrN and TiN. Alternatively, the mold releasing layer may be formed of a metal or a mixture of metals belonging to Groups 8 or 1b of the Periodic Table, more preferably, formed of a metal or a mixture of metals selected from the group consisting of Rh, Ir, Pt and Au. Further, the mold releasing layer can be formed by known film coating or depositing technology such as vacuum vapor deposition, sputtering, ion plating, plasma CVD and the like.

BRIEF DESCRIPTION OF THE DRAWINGS

The above and other objects, features and advantages of the present invention will become apparent from the following particular description of the invention, taken in conjunction with the accompanying drawings which show by way of example some preferred embodiments of the invention and in which.

DESCRIPTION OF PREFERRED EMBODIMENTS

Hereafter, the present invention is described more particulary by way of its preferred embodiments with reference to the accompanying drawings.

Figure 1:
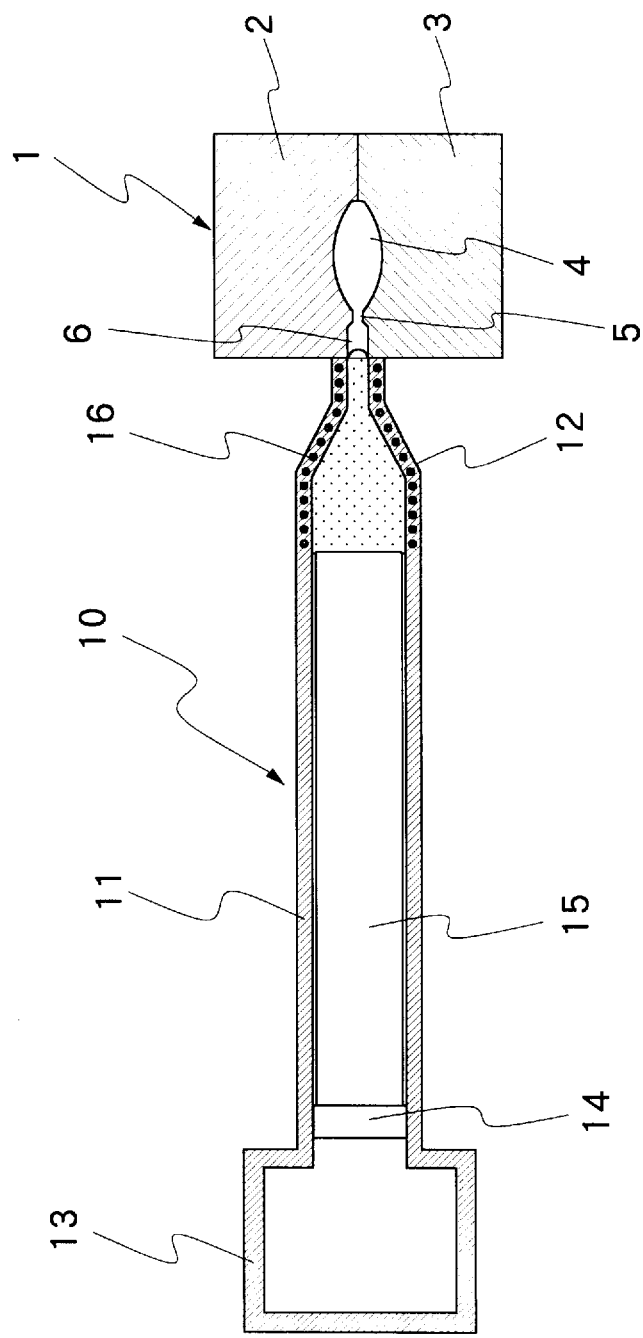
FIG. 1 shows, in a schematic sectional view, showing general layout of an apparatus for injection molding of optical glass elements.

Referring first to FIG. 1, there is schematically shown an apparatus for glass injection molding. In this figure, indicated at 1 is a split type mold set having an upper mold member 2 and a lower mold member 3 and defining a cavity 4 of predetermined shape between the upper and lower mold members 2 and 3. The mold cavity 4 is communicated with a sprue 6 through a gate 5 which is provided at the entrance to the cavity 4. The outer end of the sprue 6 is opened at one side of the mold 1 to provide an injection port. The upper and lower molds are joined in a clamped state when molten glass is injected into the mold cavity.

Indicated at 10 is a glass injection cartridge internally defining a cylinder chamber 11 which is closed except its fore end, which is fitted with a nozzle tip 12, and a pressure chamber 13 which is formed contiguously at the base end of the cylinder chamber 11. The pressure chamber 13 is connected to a fluid pressure source to apply fluid pressure to a piston which is axially slidably fitted in the cylinder chamber 11. A glass rod 15 is accommodated in the cylinder chamber 11 on the front side of the piston 14. A heater 16 is provided around the nozzle tip 12 and fore end portions of the cylinder chamber 11 thereby to heat fore end portions of the glass rod 15 into a molten state at a temperature level corresponding to a predetermined glass working viscosity, more specifically, to a temperature corresponding to a viscosity of 104 poise or lower. In this state, fluid pressure is introduced into the pressure chamber 13 to push forward the glass rod 15 through the piston 14, causing molten glass in the injection nozzle 12 to be introduced into the mold 1 under a predetermined pressure. If the temperature of the mold 1 is far lower than the glass working temperature, it is very likely for the molten glass to be cooled off and pick up viscosity to an objectionable degree prior to introduction into the mold cavity. In order to preclude troubles of this sort, the mold 1 needs to be heated up to a temperature level at or in the vicinity of the molten glass temperature prior to connecting the injection nozzle 12 thereto.

After injecting the molten glass into the mold set 1 in such a way as to fill in every corner of the mold cavity 4 as described above, the mold set 1 as a whole is cooled off in a succeeding stage, letting the injected glass material solidify in the shape of the mold cavity 4 which has transfer surfaces to be copied on glass moldings. Accordingly, molded optical elements of a predetermined shape or contour can be obtained after ejecting glass moldings by opening or disassembling mold sets 1 and cutting off surplus glass, from the sprue 6 and gate 5, by the so-called gate cutting.

Figure 2:
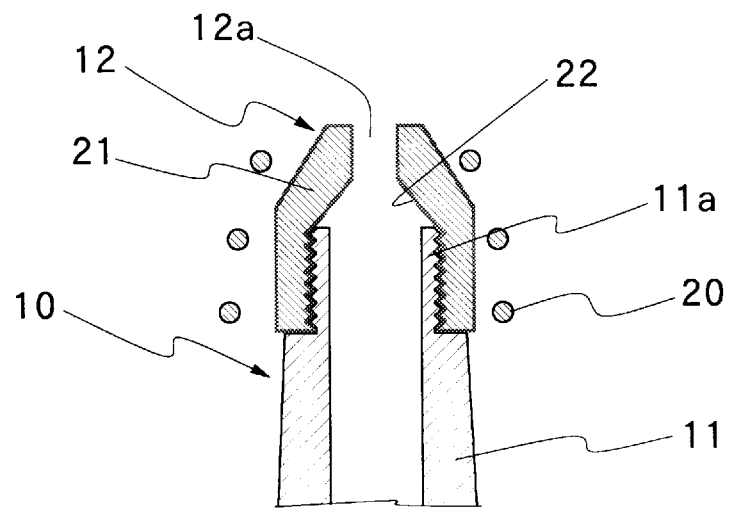
FIG. 2 is a fragmentary sectional view of a glass injection cartridge and a nozzle tip fitted on a nose end portion of the injection cartridge.

Shown in an enlarged sectional view in FIG. 2 is the nozzle tip which is attached to the fore end of the glass injection cartridge 10. As seen in this figure, the glass injection cartridge 10 is provided with a connector portion 11a contiguously at the fore end of the cylinder chamber 11, the connector portion 11a having an external screw on its outer periphery. On the other hand, the nozzle 12 tip is provided with a female screw on its inner periphery for threaded engagement with the male screw on the connecting portion 11a at the fore end of the injection cartridge 10. Further, a high frequency coil 20 is located in such a manner as to circumvent fore end portions of the cylinder chamber 11 and the injection nozzle 12 as induction heating means, thereby to heat and keep the nozzle tip 12 to and kept at the glass working temperature. The fore end of the nozzle tip 12 is tapered to form a constricted spout hole 12a which is connectable to the injection port at the outer end of the sprue 6 of the mold set 1 in the manner well known in the art.

The nozzle tip 12 has a body 21 of tungsten carbide, which is coated with a mold releasing layer 22 preferably on its entire surfaces or at least on its inner surfaces defining a molten glass passage within the nozzle body 21. This mold releasing layer 22 should have low wettability relative to molten glass, namely, should have satisfactory mold releasing characteristics in order to suppress deposition of glass at or in the vicinity of the spout hole 13 at the distal end of the nozzle tip 12. In addition to satisfactory mold releasing characteristics for molten glass, the coating layer 22 should be non-reactive with glass and should have satisfactory durability including strong adhesion to the nozzle body 21.

In order to meet these requirements, the mold releasing layer 22 is formed of a nitride or formed of a metal. More specifically, the material for the coating layer 22 is preferably formed of a nitride of elements belonging to Groups 3b, 4a, 5a and 6a of the Periodic Table, more preferably, a nitride selected from the group consisting of HfN, BN, TiAlN, CrN, ZrN and TiN. On the other hand, examples of suitable metals are those belonging to Group 8 or 1b of the Periodic Table, more preferably, a metal or a mixture of metals selected from the group consisting of Rh, Ir, Pt and Au. In order to laminate the mold releasing layer 22 in a stabilized state on the nozzle body 21, it is necessary to ensure extremely strong bond to the latter. For this purpose, it is preferable to coat the mold releasing layer 22 by film-laminating or depositing technology such as, for example, sputtering, ion plating, plasma CVD or the like.

Figure 3:
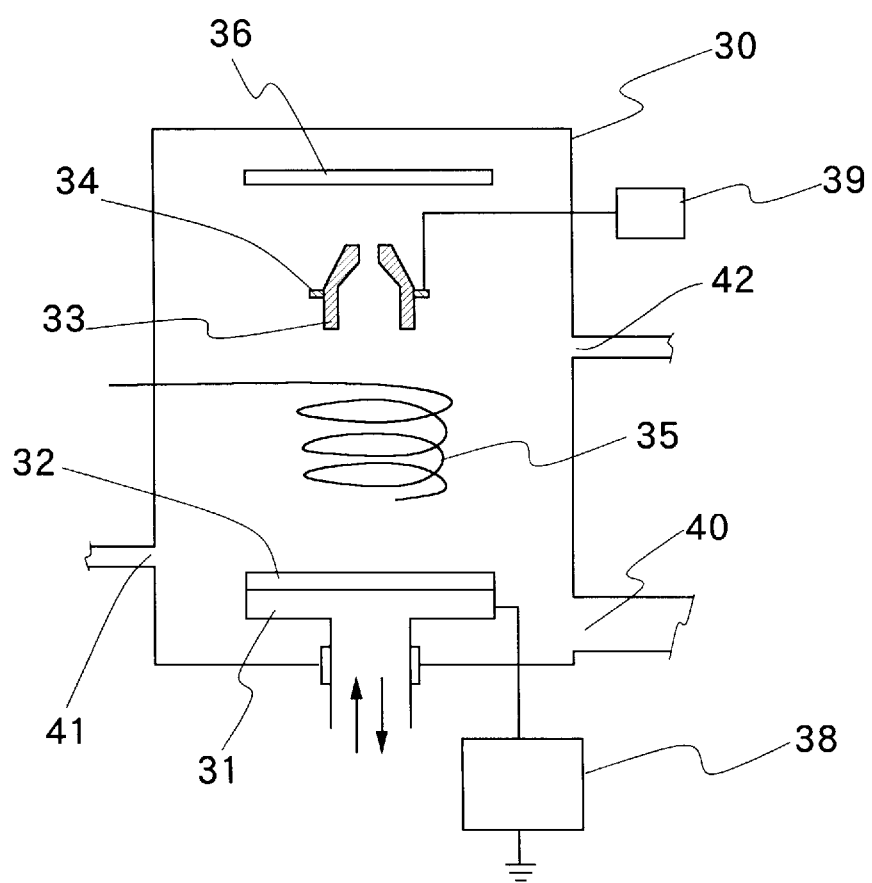
FIG. 3 is a schematic view of a sputter, shown as an example of the apparatus useful for coating a mold releasing layer of a nitride on the nozzle body.

In this regard, FIG. 3 shows a sputtering method as one example of the film-laminating method which can be suitably applied for coating the mold releasing layer 22 on the nozzle body 21. In this case, hafnium nitride (HfN) is used as a material for the mold releasing layer 22.

More particularly, FIG. 3 illustrates a sputtering method using a sputter which is arranged in the manner as follows. A target 32, which is hafnium in this case, is placed on an electrode 31 which is provided within a sputtering chamber 30. On the other hand, a work, which is a nozzle body 21 to be coated with the mold releasing layer 22, is supported on a work holder 34 in face to face relation with the target 32. A coil 35 is located between the target 32 and work 33, and a heater 36 is provided over the work 33 to heat same up to a predetermined temperature. The electrode 31 is connected to a power source 38 to generate plasma, while the work holder 34 is connected to a power source 39 for application of a negative bias. Further, high frequency current is supplied to the coil 35 for ion-etching the work 33.

The sputtering chamber 30 is provided with an exhaust port 40, an argon gas inlet port 41 and a reaction gas inlet port 42. The sputter further includes pipings which connect the exhaust port 40 and the argon gas inlet port to an exhaust duct and an argon gas supply, respectively. Through the reaction gas inlet port 42, a reaction gas such as nitrogen gas ($N_2$) or ammonium gas ($NH_3$) is introduced into the chamber 30 to produce hafnium nitride by reaction with the target hafnium. Further, cooling water is circulated within the electrode 31.

Within the sputter, which is arranged as described above, a mold releasing layer 22 of hafnium nitride is formed on surfaces of the nozzle body 21 by the method as described below.

A work 33 is set on the work holder 34 within the sputtering chamber 30, and heated up approximately to 300° C. The work holder 34 which is employed in this particular example is of a narrow ring-like shape for the purpose of forming the mold releasing film layer not only on exterior surfaces but also on interior surfaces of the work 33, i.e., inheritor surface of the molten glass passage in a nozzle tip. Besides, it is preferable to provide protuberances or ribs on circumferential surfaces of the work 33 for engagement with the work holder 34 so that the work is stably gripped on the work holder 34.

Through the exhaust port 40, the sputtering chamber 30 is evacuated to a pressure of from $10^{-5}$ to $10^{-6}$ torr. Then, a small amount of argon gas is introduced through the argon gas inlet port 41 to adjust the pressure in the chamber 30 to a level of from $10^{-3}$ to $10^{-4}$. In this state, high frequency of about 300 W is supplied to the coil 35, while a negative bias of about 1 kV is applied to the work holder 34 from the power source 39. As a result, argon ions in the plasma, which is generated by the coil 35, are caused to collide against the work 33 to wash same by ion-etching.

The power supply to the coil 35 is suspended upon finishing the washing by ion-etching. However, a negative bias is continuedly applied to the work 33, and a reaction gas such as $N_2$ gas or $NH_3$ gas is introduced into the sputtering chamber 30, while adjusting the internal pressure of the chamber 30 to a level of $10^{-2}$ to $10^{-3}$ torr. Then, power of approximately 1 kv is supplied to the electrode 31 from the plasma generating power source 38 to spatter hafnium atoms from the hafnium target 32. Spattered hafnium atoms react with the reaction gas to form a film layer of hafnium nitride on the surfaces of the work 33. By this reactive sputtering method, a film of hafnium nitride of about 2 μm is formed substantially on the enitre surfaces of the work 33, including its internal surfaces, to form a nozzle tip suitable for use in glass injection molding.

As for example, glass injection molding was conducted by the use of an injection nozzle 12 which was coated with a mold releasing film layer 22 in the above-described manner. The nozzle 12 was threaded on a connector portion at the fore end of a cylinder chamber 11 of a glass injection cartridge 10 as described above, which was loaded with a phosphate glass rod (having a working temperatre at 535° C.). The injection nozzle 12 was heated to 570° C. under induction heating by the high frequency coil 23 to heat fore end portions of the glass rod into molten state, followed by injection into a mold set to produce a molded glass lens. In the stage of injection molding, the mold releasing layer 22 on the surfaces of the nozzle tip 12 remained completely non-reactive with glass, retaining excellent mold releasing characteristics free of the troublesome phenomenon of molten glass depositions on and around the spout hole 13 of the injection nozzle 12. The molded lens product was extremely good in quality. Even after repeated use in glass injection molding, the mold releasing layer was completely insusceptible to exfoliation or any other damages.

Figure 4:
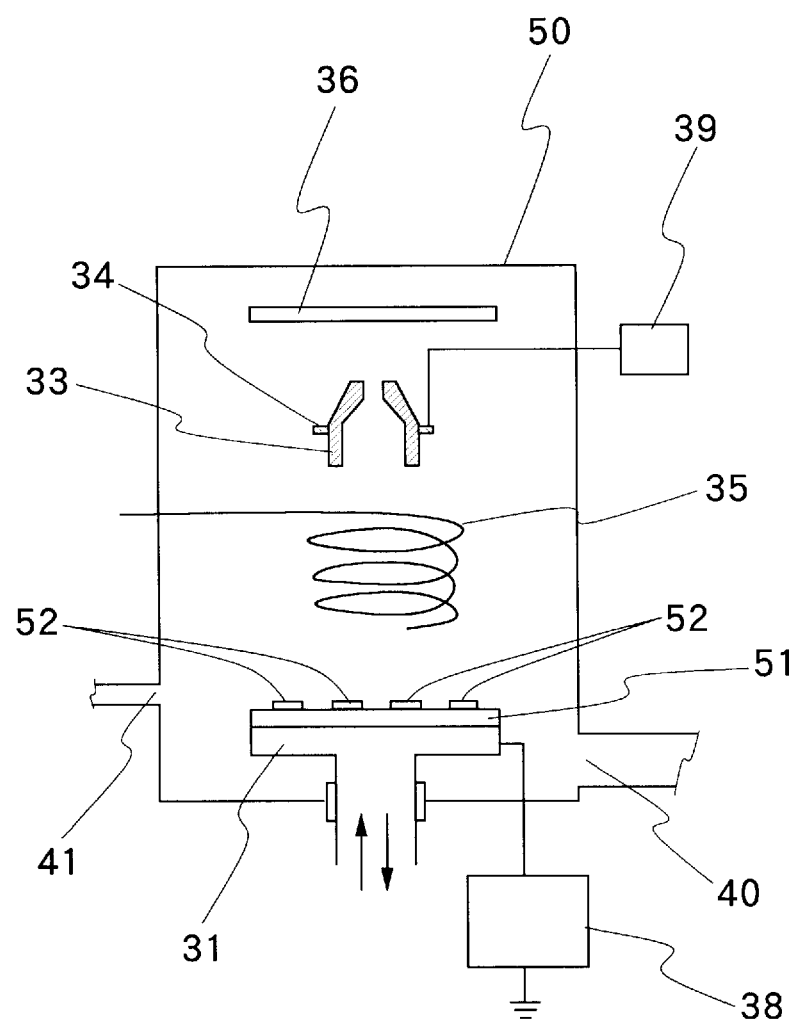
FIG. 4 is a schematic view of another sputter, shown as an example of the apparatus useful for coating a mold releasing layer of a metal alloy on the nozzle body.

Although a nitride is used for the mold releasing layer in the foregoing example, a sublayer of titanium (Ti) or nickel (Ni), for example, may be formed on the nozzle body before coating the mold releasing layer 22 in case it is difficult to obtain a sufficient film strength by directly coating a nitride on a nozzle body tungsten carbide. Alternatively, a mold releasing layer may be coated on the nozzle body by the use of a metal or metal alloy instead of a nitride. In such a case, a sputter as shown in FIG. 4 can be used in place of the sputter of FIG. 3. As an example of metal for the mold releasing layer, an alloy of platinum (Pt) and rhodium (Rh) was used in the example described below.

The sputter of FIG. 4 is almost same as the spatter of FIG. 3 in construction except for some points explained below. In FIGS. 3 and 4, equivalent components parts are designated by common reference numerals to avoid repetitions of same explanations. No reaction gas inlet is provided in the case of the sputter of FIG. 4 because it is not for reactive spattering. Besides, in addition to a first target 51 of platinum, a second target 52 of rhodium in the form of a plural number of relatively narrow strips is placed on the first target 51 in such a manner as to expose part of surfaces of the first target 51.

In this case, there is no need for introducing a reaction gas into the sputtering chamber 50 as mentioned above, so that, after introduction of argon gas, the pressure in the chamber 50 is adjusted to a level of from $10^{-2}$ to $10^{-3}$ torr. Then, after washing the work 33 by ion-etching, the plasma generating power source is turned on to start spattering of the first and second targets 51 and 52 to coat the work 33 with a thin film of a mold releasing layer consisting of an alloy of platinum and rhodium.

Of course, the mold releasing layer 22 may be coated by a film coating technology other than spattering, for example, by vacuum vapor deposition, ion plating, plasma CVD ot the like. There are no restrictions with regard to the film depositing method as long as it can form a thermally strong coating film in view of the high temperature conditions under which nozzle tips are used.

Table 1 below shows the results of glass injection molding tests using nozzle tips 12 having respective tungsten carbide bodies 22 coated with mold releasing layers 22 of different materials. As clear from this table, the mold releasing layers coated on nozzle bodies were greatly effective in improving mold releasing characteristics, preventing deposition of solidified glass on and around a spout hole of the nozzle tip.

TABLE 1

| Coating material | Non-Reactiveness | Releasability | Durability | Lens Quality |
|---|---|---|---|---|
| HfN | ◎ | ◎ | ◎ | ◎ |
| BN | ◎ | ◎ | ◎ | ◎ |
| TiAlN | ○ | ○ | ◎ | ◎ |
| CrN | ○ | ◎ | ○ | ○ |
| ZrN | Δ | ○ | Δ | Δ |
| TiN | Δ | ○ | Δ | Δ |
| Pt-Rh | ○ | ◎ | ○ | ◎ |
| Pt-Ir | ○ | ◎ | ○ | ◎ |
| Pt-Au | Δ | ◎ | Δ | ○ |
| Pt | Δ | ○ | Δ | Δ |
| Au | Δ | ◎ | Δ | Δ |
| No Coating | X | ○ | X | X |

◎: Extremely good
○: Good
Δ: Acceptable
X: Unacceptable

What is claimed is:

1. A nozzle tip for a glass injection cartridge loaded with a rod-shaped glass material and having a heater for melting down the glass material into a molten state for injection into a mold, the nozzle tip comprising:

a) a nozzle body having a conical shape converging forwardly from a rear-end portion fitted on a fore-end portion of the glass injection cartridge, the nozzle body being formed of tungsten carbide and internally defining a molten glass passage extending axially throughout the nozzle body from the rear-end portion toward a converging fore-end portion to be connected to the mold; and b) a glass releasing layer coated substantially on an entire surface of the nozzle body including the molten glass passage, wherein said glass releasing layer is selected from the group consisting of HfN, BN, TiAlN, CrN, ZrN and TiN.

2. The nozzle tip of claim 1, wherein said glass releasing layer is laminated on an undercoat metal layer formed on a base metal of said nozzle body.

3. The nozzle tip of claim 1, wherein said glass releasing layer is HfN.

4. The nozzle tip of claim 1, wherein said glass releasing layer is BN.

5. The nozzle tip of claim 1, wherein said glass releasing layer is TiAlN.

6. The nozzle tip of claim 1, wherein said glass releasing layer is CrN.

7. The nozzle tip of claim 2, wherein said undercoat metal layer is formed of titanium or nickel.

8. The nozzle tip of claim 1, wherein said mold releasing layer is formed on said nozzle body by vacuum vapor deposition, sputtering, ion plating or plasma CVD.

* * * * *